United States Patent
Gruendl et al.

(10) Patent No.: US 9,865,785 B2
(45) Date of Patent: Jan. 9, 2018

(54) OPTOELECTRONIC COMPONENT AND METHOD OF PRODUCTION THEREOF

(71) Applicant: OSRAM Opto Semiconductors GmbH, Regensburg (DE)

(72) Inventors: Andreas Gruendl, Laaber (DE); Tobias Gebuhr, Regensburg (DE); Markus Pindl, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/039,303

(22) PCT Filed: Nov. 28, 2014

(86) PCT No.: PCT/EP2014/075967
§ 371 (c)(1),
(2) Date: May 25, 2016

(87) PCT Pub. No.: WO2015/079027
PCT Pub. Date: Jun. 4, 2015

(65) Prior Publication Data
US 2017/0033271 A1    Feb. 2, 2017

(30) Foreign Application Priority Data

Nov. 29, 2013    (DE) .................. 10 2013 224 581

(51) Int. Cl.
*H01L 33/62* (2010.01)
*H01L 23/00* (2006.01)
(Continued)

(52) U.S. Cl.
CPC .............. *H01L 33/62* (2013.01); *H01L 24/48* (2013.01); *H01L 33/486* (2013.01); *H01L 33/54* (2013.01);
(Continued)

(58) Field of Classification Search
None
See application file for complete search history.

(56) References Cited

U.S. PATENT DOCUMENTS

| 2010/0053929 A1 | 3/2010 | Bisberg |
| 2012/0080674 A1 | 4/2012 | Shimizu et al. |

(Continued)

FOREIGN PATENT DOCUMENTS

| CN | 102844897 | 12/2012 |
| DE | 10 2006 017 294 A1 | 7/2007 |

(Continued)

OTHER PUBLICATIONS

English translation of a Notification of Reasons for Rejection dated Jul. 11, 2017, of corresponding Japanese Application No. 2016-535044.

(Continued)

*Primary Examiner* — Whitney T Moore
(74) *Attorney, Agent, or Firm* — DLA Piper LLP (US)

(57) ABSTRACT

A method of producing an optoelectronic component includes providing a lead frame subdivided by a separating region into first and second lead frame parts, carrying out etching in which at least one trench structure is produced on the upper side of the first lead frame, producing a molded body by molding a molding material around the lead frame such that 1) a cavity is formed and exposes a region of the upper side of the first lead frame part and a region of the upper side of the second lead frame part, and 2) the trench structure is provided on the upper side of the exposed region of the first lead frame part, and arranging the optoelectronic semiconductor chip on the upper side of the exposed region of the first lead frame part such that the trench structure is used as an alignment mark.

13 Claims, 12 Drawing Sheets

(51) Int. Cl.
*H01L 33/54* (2010.01)
*H01L 33/48* (2010.01)

(52) U.S. Cl.
CPC ............. *H01L 2224/32245* (2013.01); *H01L 2224/48247* (2013.01); *H01L 2224/48464* (2013.01); *H01L 2224/73265* (2013.01); *H01L 2224/92247* (2013.01); *H01L 2924/181* (2013.01); *H01L 2933/005* (2013.01); *H01L 2933/0033* (2013.01); *H01L 2933/0066* (2013.01)

(56) References Cited

U.S. PATENT DOCUMENTS

| | | |
|---|---|---|
| 2012/0138967 A1 | 6/2012 | Shimizu et al. |
| 2013/0099270 A1 | 4/2013 | Kobayashi et al. |
| 2013/0105851 A1 | 5/2013 | Kim |
| 2013/0121000 A1 | 5/2013 | Lee et al. |
| 2013/0343067 A1* | 12/2013 | Okada ............... F21V 21/00 362/382 |

FOREIGN PATENT DOCUMENTS

| | | |
|---|---|---|
| DE | 11 2011 103 147 T5 | 7/2013 |
| JP | 04-088693 A | 3/1992 |
| JP | 2006-294982 | 10/2006 |
| JP | 2008-258455 A | 10/2008 |
| JP | 2012-033919 | 2/2012 |
| JP | 2013-125776 | 6/2013 |
| JP | 2013-236113 | 11/2013 |
| WO | 2006/023300 A2 | 3/2006 |
| WO | 2012/117974 A1 | 9/2012 |

OTHER PUBLICATIONS

German Office Action dated Jun. 25, 2014 for German Application No. 10 2013 224 581.5.
Notification of the First Office Action dated Sep. 20, 2017, of corresponding Chinese Application No. 2014800634490 in English.

* cited by examiner

OPTOELECTRONIC COMPONENT AND METHOD OF PRODUCTION THEREOF

TECHNICAL FIELD

This disclosure relates to an optoelectronic component and to a method of producing an optoelectronic component.

BACKGROUND

Optoelectronic components generally comprise one or more optoelectronic semiconductor chips of generating light radiation, and a carrier used as a package for the semiconductor chip. The optoelectronic semiconductor chip is, for example, a light-emitting diode (LED) chip, in which case conversion elements for radiation conversion may be arranged on the light-emitting diode chips, depending on the application. A metal lead frame embedded in a molded body made of a molding material is in this case generally used as the carrier. Production of the molded body is in this case generally carried out by molding a plastic, epoxy resin or silicone around the lead frame in the scope of an injection molding, transfer molding or compression molding method. In this case, a package forming a cavity of receiving the semiconductor chip is simultaneously produced from the molding material on the carrier. During the subsequent assembly process, the optoelectronic semiconductor chip is fastened on the surface of the lead frame in the region of the cavity and is electrically connected. The production of optoelectronic components is in this case typically carried out on a panel, the individual components being processed in parallel with one another in a matrix arrangement. During the common assembly process, each package is individually approached and equipped with the associated semiconductor chip. Depending on the application, maximally accurate alignment of the semiconductor chip is in this case necessary. To this end, reference points which are as accurate as possible are needed. Since, because of the process, a position tolerance occurs between the package material and the lead frame during production of the package by an injection-compression molding or injection molding method, referencing to the package material, or particular package parts, necessarily leads to an increased tolerance during the assembly process. To avoid this problem, a lead frame marking arranged on the outer edge of the common lead frame is used for referencing the assembly processes. This alignment mark must be approached repeatedly during the assembly process, which leads to a significant reduction of the process speed.

It could therefore be helpful to provide referencing for the assembly process that increases the process speed without the disadvantage of a tolerance increase due to an offset of the lead frame and the package.

SUMMARY

We provide a method of producing an optoelectronic component including a lead frame embedded in a molded body and an optoelectronic semiconductor chip arranged on an upper side of the lead frame including providing a led frame subdivided by a separating region into a first lead frame part and a second lead frame part, carrying out an etching step in which at least one trench structure is produced on the upper side of the first lead frame part, producing the molded body by molding a molding material around the lead frame such that 1) a cavity is formed and exposes a region of the upper side of the first lead frame part and a region of the upper side of the second lead frame part, and 2) the trench structure is provided on the upper side of the exposed region of the first lead frame part, and arranging the optoelectronic semiconductor chip on the upper side of the exposed region of the first lead frame part such that the trench structure is used as an alignment mark to align the optoelectronic semiconductor chip on the first lead frame part.

We also provide the method of producing an optoelectronic component including a lead frame embedded in a molded body and an optoelectronic semiconductor chip arranged on an upper side of the lead frame including providing a led frame subdivided by a separating region into a first lead frame part and a second lead frame part, carrying out an etching step in which at least one trench structure is produced on the upper side of the first lead frame part, producing the molded body by molding a molding material around the lead frame such that 1) a cavity is formed and exposes a region of the upper side of the first lead frame part and a region of the upper side of the second lead frame part, and 2) the trench structure is provided on the upper side of the exposed region of the first lead frame part, and arranging the optoelectronic semiconductor chip on the upper side of the exposed region of the first lead frame part such that the trench structure is used as an alignment mark to align the optoelectronic semiconductor chip on the first lead frame part, wherein the trench structure is filled in a planar fashion with the molding material in the scope of the production of the molded body.

We further provide an optoelectronic component including a lead frame subdivided by a separating region into a first lead frame part and a second lead frame part, a molded body that embeds the lead frame and forms a package having a cavity that exposes a region of the upper side of the first lead frame part and a region of the upper side of the second lead frame part, at least one trench structure which is used as an alignment structure being provided on the upper side of the exposed region of the first lead frame part, and at least one optoelectronic semiconductor chip that generates light radiation arranged on the upper side of the exposed region of the first lead frame part.

Figure 1:
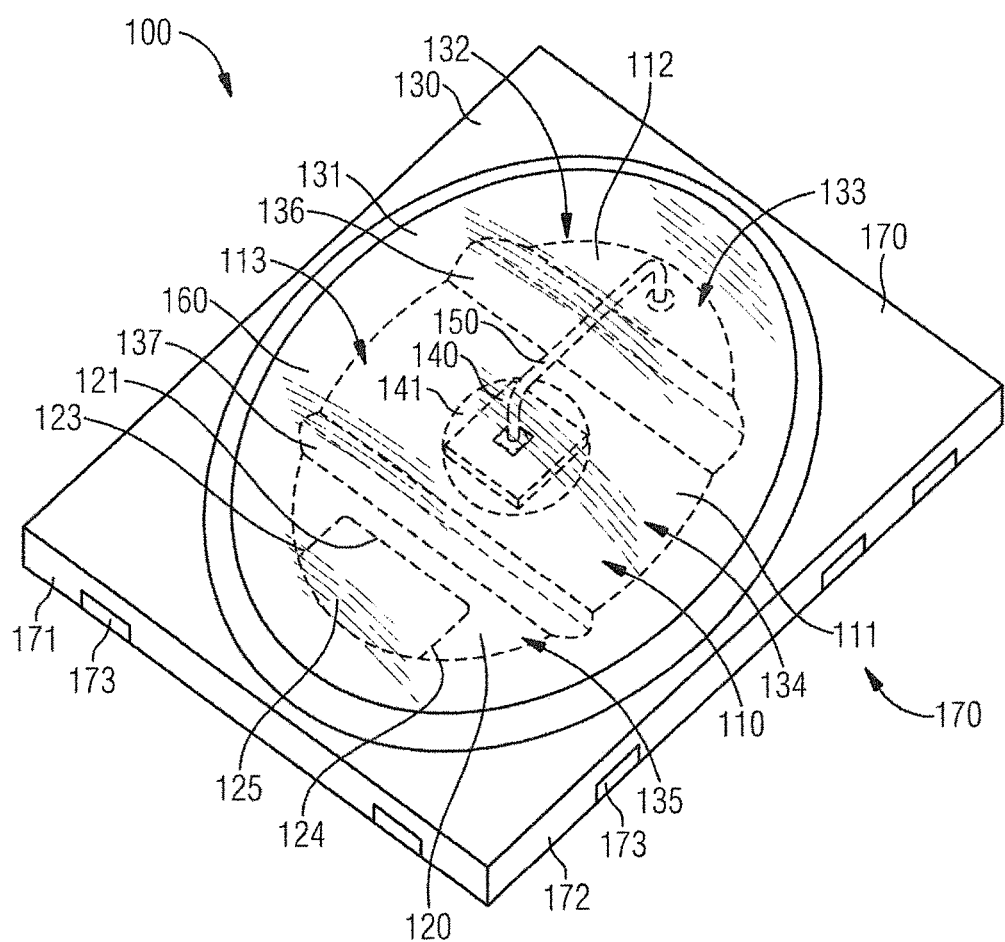
FIG. 1 shows a perspective view of a first example of the optoelectronic component with an alignment mark configured in the form of a trench structure in the lead frame.

LIST OF REFERENCES 100 optoelectronic component
110 lead frame
111 first lead frame part
112 second lead frame part
113 upper side
114 lower side
115 shoulder structure
116, 117 rear contact pad
118 separating region
119 coating
120 trench structure
121-124 edges of the trench structure
125 island region surrounded by the trench structure
126 insulated island region
130 molded body
131 package
132 cavity
133-135 window regions
136, 137 bar-shaped structures
138 filling of the trench structure
140 optoelectronic semiconductor chip
141 adhesive pellet under optoelectronic semiconductor chip
150 bonding wire
151, 152 contact positions of the bonding wire
160 encapsulation compound
170 carrier
171, 172 side surfaces of the carrier
173 connecting bars of the lead frame
200 first lithographic mask
201-204 structuring region of the upper side
210 second lithographic mask
211-213 structuring region of the lower side
300 molding tool
310 first molding tool part
311 core structure of the first molding tool part
312-314 section of the core structure
315 sealing surface
316-319 cavity of the first molding tool part
320 second molding tool part
321 bearing surface

DETAILED DESCRIPTION

We provide a method of producing an optoelectronic component comprising a lead frame embedded in a molded body and an optoelectronic semiconductor chip arranged on an upper side of the lead frame. The method comprises providing a lead frame, carrying out an etching step, in which at least one trench structure is produced in the lead frame on the upper side of the lead frame, producing of the molded body by molding a molding material around the lead frame, and arranging the optoelectronic semiconductor chip on the upper side of the lead frame, the at least one trench structure being used as an alignment mark to align the optoelectronic semiconductor chip on the lead frame. The trench structure, produced in the lead frame with the aid of a lithographic process, has extremely accurate edges whose precise position is subject only to the small tolerances of the lithography process. The trench structure therefore represents an alignment structure, or alignment mark, with clear edges in the assembly process, which allows optimal alignment of the semiconductor chip on the lead frame. Since it is present directly locally at the mounting position of the respective semiconductor chip, the need for repeated approaching of a global mark on the outermost edge of the lead frame is not necessary. In this way, in turn, the speed of the assembly process can be increased and a higher throughput can consequently be achieved in the method of producing the optoelectronic components. Furthermore, the number of misalignments can be reduced with the aid of the accurate alignment structures.

The trench structure may be produced in the scope of photolithographic structuring of the lead frame, carried out from the upper and lower sides, in which the lead frame is fully separated in at least one specified region by upper- and lower-side etching. In this case, the lead frame structure is etched only on the upper side in a region intended for the trench structure to produce the trench structure. Because of the etching only on the lead frame upper side, the lead frame is not separated in this region. Rather, the desired trench structure is advantageously produced together with the structuring of the lead frame from a starting lead frame. In this way, the number of method steps can be reduced.

The trench structure may be filled in a planar fashion with a filler material to increase the contrast with respect to the material of the lead frame. By using a suitable filler material within the trench structure, the optical contrast between the trench structure and the lead frame surrounding the trench structure can be made as high as is desired. This allows rapid and reliable detection of the alignment marks formed by the trench structure, or its edges, by a corresponding optical detection system during the assembly process.

The trench structure may be filled in a planar fashion with the molding material in the scope of the production of the molded body. In this way, filling of the trench structure is advantageously carried out without additional method steps.

A coating that forms an optical contrast with respect to the material of the lead frame may be produced on the upper side of the lead frame. In this case, the coating is removed in the region of the trench structure during the process. A correspondingly suitable coating on the surface of the lead frame consequently allows rapid and reliable detection of the edges of the trench structure which are used as alignment marks. The coating may furthermore be assigned other functions, for example, corrosion protection.

The trench structure may be produced with at least one straight edge that forms a sharp transition between etched and unetched regions of the lead frame. In this case, the at least one straight edge is used as an alignment mark during alignment of the optoelectronic semiconductor chip on the lead frame. With the aid of straight edges, besides particular X-Y positions, it is also possible to specify particular directions or direction axes that simplifies alignment of the optoelectronic semiconductor chip on the lead frame.

The trench structure may be produced with an island region contained by the at least one straight edge. Furthermore, the surface of the island region is sealed from the trench structure during production of the molded body. An island region engaging in the trench structure, or arranged insulated in the trench structure, makes it possible for as large a part as possible of the outer edge of the trench structure to extend outside the cavity. Since the edge regions of the trench structure extending beyond the cavity therefore extend below the package, sufficient bonding of the trench structure to the molding tool cavity forming the package is obtained when the molding material is being molded around the lead frame. It is therefore possible to ensure that the trench structure is fully filled during injection molding, transfer molding or compression molding method. Sealing the island region is in this case carried out by a sealing surface, bearing on the surface of the island region, of a mold core of the upper molding tool part, which core engages in the region of the package cavity. Sealing prevents the molding material from flowing over the edge of the trench structure onto the surface of the island region and blurring the transition, used as an alignment mark, between the molding material of the trench structure and the metal of the lead frame.

The molded body may be produced with a package, arranged on the upper side of the lead frame forming a cavity to receive the optoelectronic semiconductor chip. In this case, the trench structure is produced in the region of the cavity. Alignment of the semiconductor chip in the assembly process is facilitated by arrangement of the trench structure in the immediate vicinity of the mounting position of the semiconductor chip.

At least one edge region of the trench structure may be produced in a region outside the cavity. In this way, a connection of the trench structure to a molding tool cavity that forms the package of the component is produced. It is therefore possible to ensure that the trench structure is filled in a planar fashion when the molding material is being molded around the lead frame.

We further provide an optoelectronic component comprising a lead frame, at least one optoelectronic semiconductor chip that generates light radiation, arranged on the upper side of the lead frame, and a molded body that embeds the lead frame and forms a package for the at least one optoelectronic semiconductor chip. In this case, the lead frame has on its upper side at least one trench structure generated by a photolithographic process and used as an alignment structure. Because of the high precision of the photolithographically produced trench structure, the position of the optoelectronic semiconductor chip on the lead frame is established very precisely.

The lead frame may have at least one separating region in which the lead frame was fully separated in a two-stage photolithographic structuring process by upper- and lower-side etching. In this case, the trench structure is configured in the form of a structuring region of the lead frame etched only on the upper side in the two-stage photographic structuring process.

The package may form a cavity receiving the optoelectronic semiconductor chip, the trench structure being arranged in the region of the cavity.

The trench structure may comprise an island region forming at least one straight edge with the trench structure. The at least one straight edge is in this case configured as an alignment structure.

The trench structure may be filled in a planar fashion with the molding material of the molded body. In this way, the contrast between the trench structure and the unetched lead frame surrounding the trench structure is increased.

The above-described properties, features and advantages, as well as the way in which they are achieved, will become more clearly and comprehensively understandable in connection with the following description of examples, which will be explained in more detail in connection with the drawings.

FIG. 1 shows a perspective view of an optoelectronic component 100 configured according to a first example comprising a carrier 170, an optoelectronic semiconductor chip 140 mounted on the carrier, and a package 131 arranged on the carrier 170 and receiving the optoelectronic semiconductor chip 140. A lead frame 110 embedded in a molded body 130 formed from a molding material is used as the carrier. The package 131 is configured in the form of an oval border forming a cavity 132 to receive the optoelectronic semiconductor chip 140. The cavity 132 is subdivided into three sections 133, 134, 135 by two bar-shaped structures extending transversely to the longitudinal axis of the elliptical package. The optoelectronic semiconductor chip 140 is mounted directly on the surface of the frame element 110 in the central section 134 of the cavity 132 by a solder or an adhesive pellet 141. The lead frame 110 is constructed in two parts, the semiconductor chip being fastened on a first lead frame part 111 and electrically connected to a second lead frame part 112, arranged in the first section 133 of the cavity 132, by a bonding wire 150 contacting the semiconductor chip 140 on the upper side. The lead frame 110, constructed in two parts, is fully covered with the molding material forming the molded body 130 on its upper side 114, except for the region of the cavity 132. Inside the cavity 132, the sections 133, 134 of the lead frame 110 which are separated by the bar-shaped structure 136, are free of molding material. Conversely, the third section 135 of the cavity contains a trench structure 120 produced by etching in the first frame part 111. The trench structure 120 has a rectangular cutout forming an island region 125 engaging in the third cavity section 135. The edges 121, 123, 124 of the trench structure 120 formed by photolithographic structuring constitute very precise alignment marks used in the scope of the assembly process for very accurate alignment of the optoelectronic semiconductor chip 140 on the lead frame 110, or on the first lead frame part 111. Since the trench structure 120 is filled in a planar fashion with the molding material of the molded body 130 in this example, a particularly high contrast between the planar-filled trench structure 120 and the island region 125, not covered by the molding material, of the first lead frame part 111 is obtained at the edges 121, 123, 124 of the trench structure 120.

FIG. 1 shows the finished produced optoelectronic component 100 after its individualization. The optoelectronic component 100 typically comprises an encapsulation compound (not represented here for the sake of clarity) filling the cavity 132. The encapsulation compound, used inter alia to protect the semiconductor chip 140 and the bonding wire 150, may be configured in the form of a convex lens. With the aid of a transparent material, collimation of the radiation emitted by the optoelectronic semiconductor chip 140 can be achieved. Conversely, with the aid of opaque materials of the light emitted by the optoelectronic semiconductor chip 140 over a larger area can be achieved.

The optoelectronic component 100 shown in FIG. 1 is typically processed on a panel having a multiplicity of similar optoelectronic components. In this case, the individual components may be connected to one another by connecting bars of the lead frame, which are not separated until the individualization of the components. In the example shown in FIG. 1, such connecting bars 173 can be seen in the side surfaces 171, 172 of the carrier 170 formed by the individualization of the components.

Figure 2:
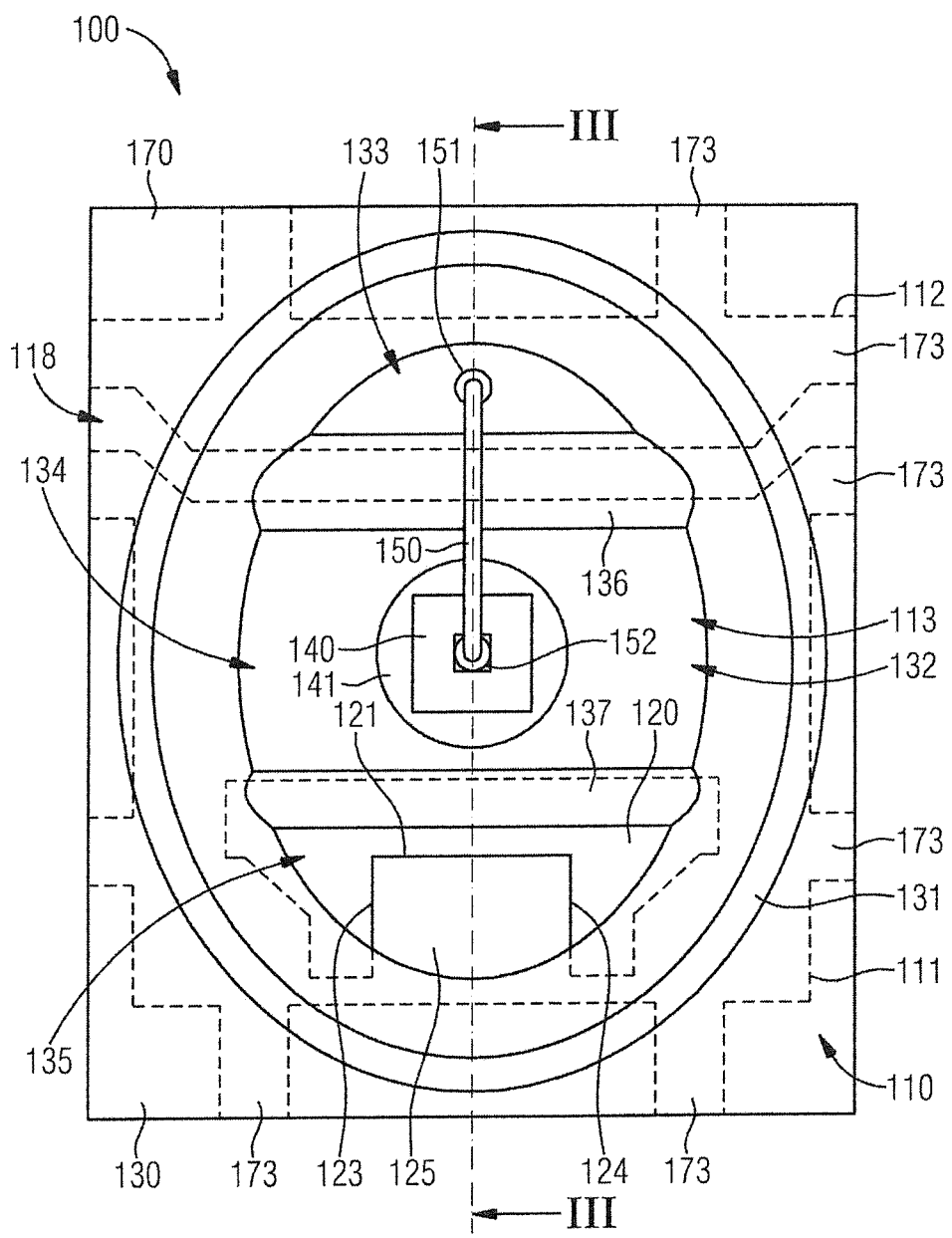
FIG. 2 shows a plan view of the optoelectronic component of FIG. 1 with internal structures of the lead frame indicated.

FIG. 2 shows a plan view of the optoelectronic component 100 of FIG. 1 with the carrier 170 formed from a lead frame 110 around which molding material is molded. The lead frame 110 embedded in the molding material of the molded body 130 is constructed in two parts, the regions of the two lead frame parts 111, 112 which are covered with molding material and therefore generally not visible in plan view, are represented by dashed lines. As can be seen from FIG. 2, the two lead frame parts 111, 112 are electrically insulated from one another by the separating region 118 filled with molding material of the molded body 170. The first lead frame section 111 extends over the second and third cavity sections 134, 135, while the second lead frame part 112 is restricted to the first cavity section 133. The trench structure 120, used as an alignment structure to align the semiconductor chip 140 during the assembly process, lies on the first lead frame part 111, as does the semiconductor chip 140 itself. A maximally high accuracy is therefore achieved during alignment of the semiconductor chip 140 in relation to the first lead frame part 111.

In the following example, the trench structure arranged in the third cavity section 135 has an essentially rectangular cutout 125 that imparts an essentially O-shaped base surface to the trench structure 120. The cutout 125 forms an island region, extending into the third cavity section 135, of the first lead frame part 111, this island region being bounded by three edges 121, 123, 124 of the trench structure 120 produced with high precision in the photolithographic process. To increase contrast, the trench structure 120 is filled in a planar fashion with the molding material of the molded body 130. To ensure sufficient filling of the trench structure 120, the trench structure 120 extends to below the package 131. A sufficient flow of material into the trench structure 120 is therefore ensured when molding around the lead frame 110. The bar-shaped structure 137, extending parallel to the upper outer edge of the trench structure 120, also has the same purpose.

As can furthermore be seen from FIG. 2, the two lead frame parts each have a plurality of connecting bars 173, by which a connection to neighboring components has been produced during the production process of the component. These connecting bars 173 were separated when the panel was sawed into individual components.

Figure 3:
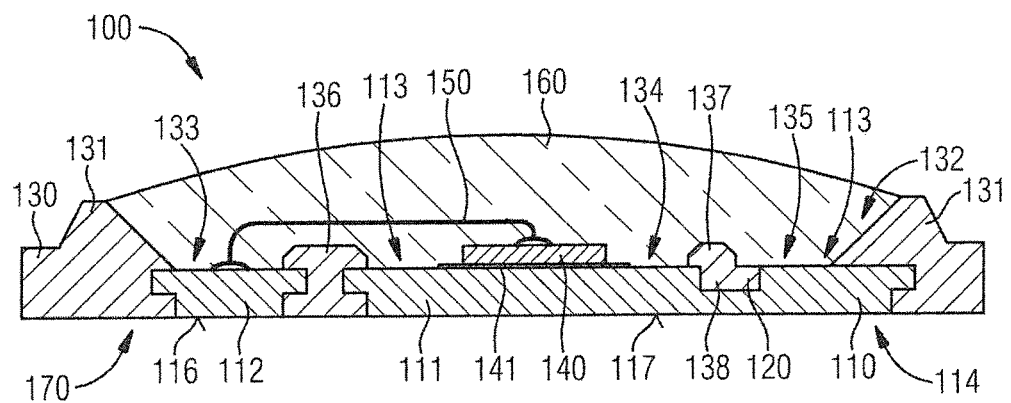
FIG. 3 shows a cross-sectional representation through the optoelectronic component of FIGS. 1 and 2 along the section line I-I.

FIG. 3 schematically shows a cross section through the optoelectronic component 100 of FIG. 2 along the section plane I-I. Embedding the two-part lead frame 110 in the molded body 130 formed from a molding material can be seen clearly in this schematic representation. The package 131, configured as part of the molded body 130, has a profile tapering upward. The cavity 132 enclosed by the package 131 is filled with an encapsulation compound 160 extending beyond the package 131. The encapsulation compound 160, consisting of silicone, for example, may comprise scattering particles that allow an approximately uniform light distribution of the light emitted by the semiconductor chip 140 over the entire outer surface of the encapsulation compound 160.

The two-part lead frame 110 has step-shaped shoulder structures 115 that improve mechanical anchoring of the molded body 130 to the lead frame parts 111, 112. The shoulder structures 115 are preferably produced in a two-stage lithographic structuring process during which the trench structure 120 formed on the upper side 113 of the first lead frame part 111 is simultaneously produced.

Figure 4:
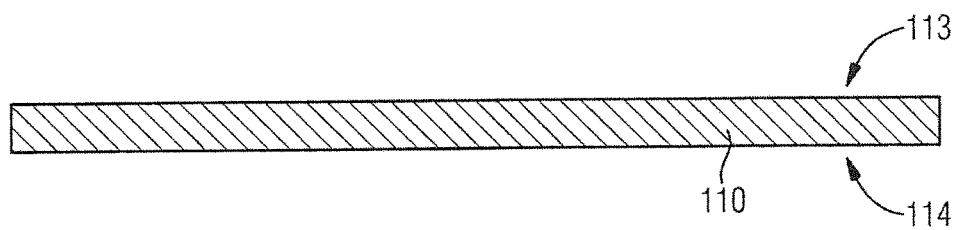
FIG. 4 shows a lead frame at the start of the production process of the optoelectronic component.

The following FIGS. 4 to 11 explain a possible production method of producing the optoelectronic component shown in FIGS. 1 to 3. To this end, as is shown in FIG. 4, a metal plate used as a starting lead frame 110 is initially provided. In this example, the lead frame 110 consists of copper, which may depending on the application have an outer metal coating, for example, of gold. In principle, any suitable metal or metal alloy may be a material for the lead frame 110, and optionally for the coating.

A sizeable number of optoelectronic components are typically processed together on a starting lead frame to increase the throughput. The components arranged next to one another are in this case generally individualized by a separating process only after their production. For reasons of clarity, however, only the processing of a single optoelectronic component is represented in the drawings.

Figure 5:
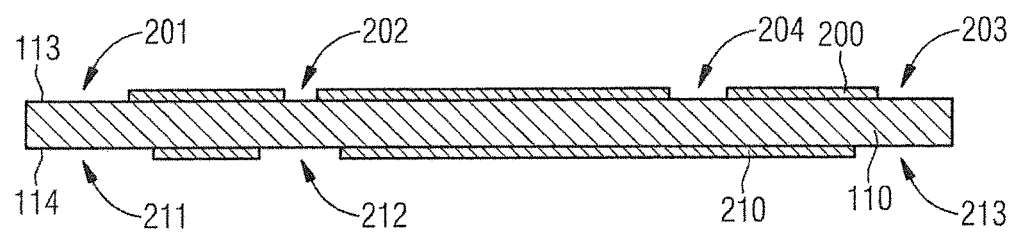
FIG. 5 shows the lead frame of FIG. 4 with photolithographic masks arranged on both sides for structuring the lead frame.

The structuring of the lead frame 110 is typically carried out by a photolithographic method. The photolithographic process is carried out in two stages, i.e., from the upper and lower sides by two masks matched to one another. To this end, a photolithographic mask 200, 210 is respectively produced on both the upper and the lower sides 113, 114 of the unstructured lead frame 110, by deposition of a photosensitive layer and illumination and development of the illuminated layer. As shown in FIG. 5, the structuring regions 201, 202, 203, 211, 212, 213 of the lead frame, which are intended for the etching, are defined by corresponding opening regions of the two masks 210, 220. The structuring regions 201, 202, 203 of the upper mask 200 correspond essentially to the corresponding structuring regions 211, 212, 213 of the lower mask 210. To produce the desired trench structure on the upper side 113 of the first lead frame part 111, the upper photolithographic mask 200 has an additional opening 204 in the region intended therefor.

Figure 6:
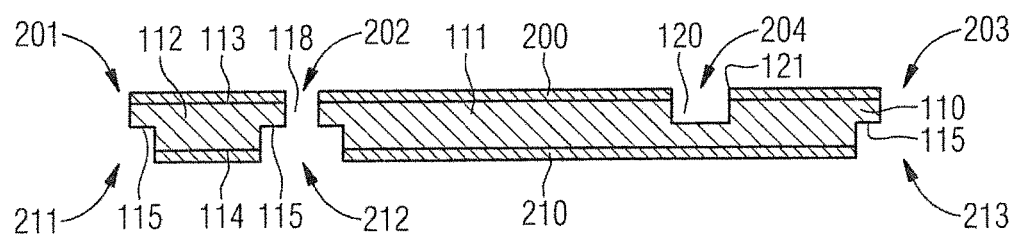
FIG. 6 shows the finished structured lead frame with a trench structure produced on the upper side of the lead frame.
Figure 7:
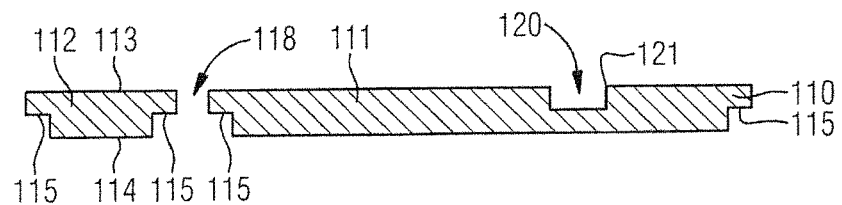
FIG. 7 shows the lead frame of FIG. 6 after removal of the photolithographic masks.

During the subsequent etching of the lead frame 110, preferably carried out simultaneously on the upper and lower sides 113, 114, the material of the lead frame is respectively eroded in the structuring regions 201, 202, 203, 204, 211, 212, 213 to half the thickness of the lead frame 110. In this case, the lead frame is fully separated in the regions 201, 202, 204. This method state is shown in FIG. 6. In this way, at each component position of the common lead frame, an individual lead frame 110 subdivided into two parts 111, 112 by a separating region 118 is respectively formed. As can be seen in FIG. 6, step-shaped shoulder structures 115 have been produced in the separating regions of the lead frame 110 by an offset of the two masks 200, 210. Since the fourth structuring region 204 of the upper mask does not have a corresponding structuring region in the lower mask 210, the lead frame 110 has only been etched on the upper side in this region so that the desired trench structure 120 has been formed here. After removal of the two masks 200, 210, the two-part lead frame 110 with the trench structure 120 formed on the upper side 113 of the first lead frame part 111 is obtained. In this case, the trench structure 120 has at least one defined, preferably straight edge 121, the position of which is determined only by the minimal tolerance of the lithography process. This method state is represented in FIG. 7.

In a subsequent method step, a molding material transfer process (molding process) is carried out to mold a molding material around the structured lead frame 110. In principle, any suitable thermoplastic or heat-curing material may be used as the molding material. In this case, various techniques may be used to mold the molding material around the lead frame, for example, injection molding, transfer molding or compression molding.

Figure 8:
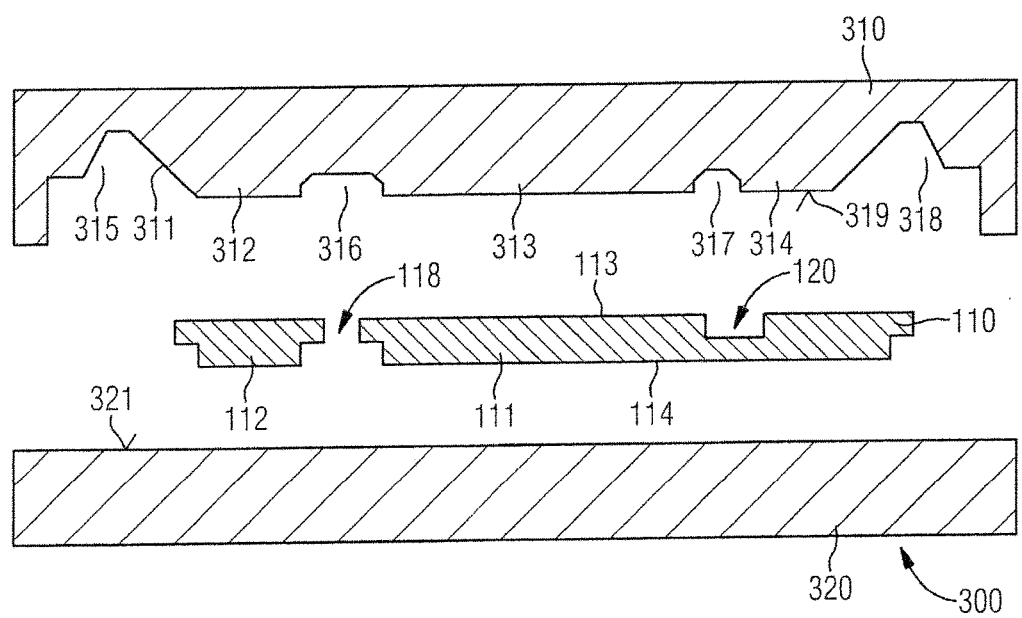
FIG. 8 shows a molding tool receiving the structured lead frame.
Figure 9:
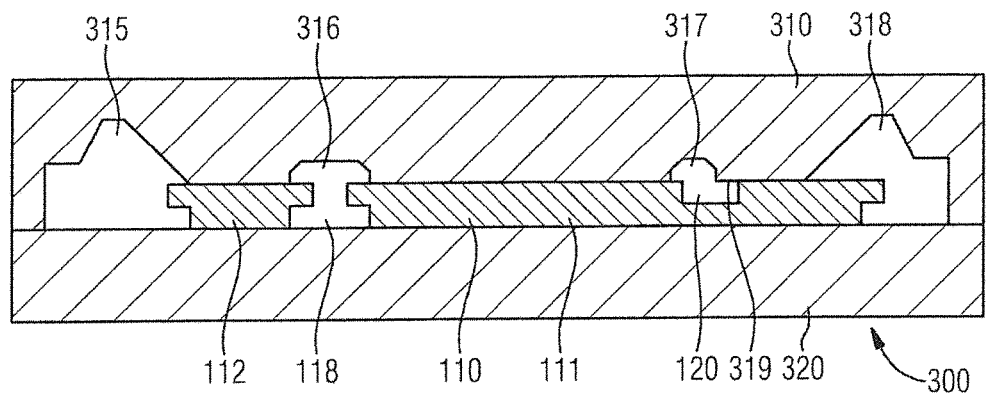
FIG. 9 shows the lead frame arranged in the molding tool at the start of the injection molding process.
Figure 10:
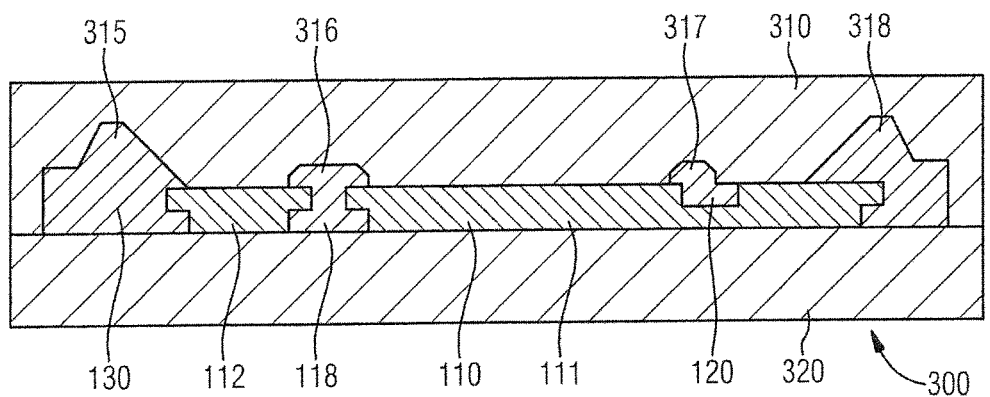
FIG. 10 shows the molded arrangement of FIG. 9 at the end of the injection molding process.
Figure 11:
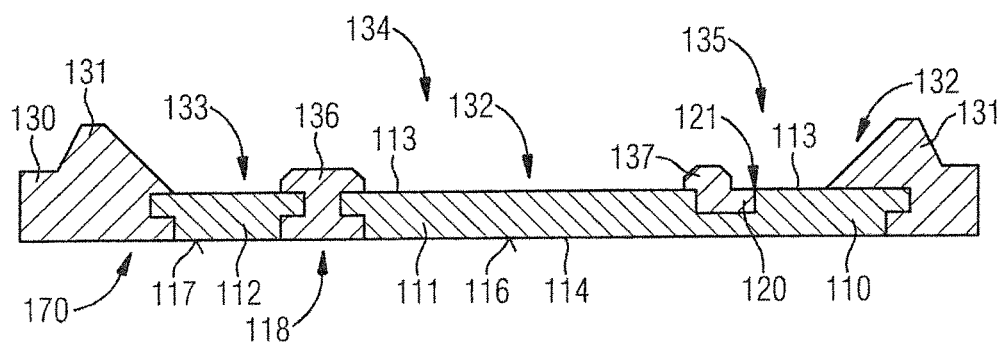
FIG. 11 shows the lead frame with molding material molded around it with a package formed from the molding material on the upper side of the lead frame.

To mold an epoxide, silicone or another suitable molding material around the lead frame 110, the etched lead frame 110 is subsequently placed in a molding tool 300. As is shown in FIG. 8, the molding tool 300 comprises, for example, an upper and a lower molding tool part 310, 320 between which the etched lead frame 110 is positioned. The lower molding tool part 320 has a preferably planar bearing surface 321 for the etched lead frame 110. Conversely, a molding tool cavity 315, 318 for molding the component package is provided in the upper molding tool part 310. The molding tool cavity 315, 318, which in the following example is configured in the form of an oval depression, contains a mold core 311 having a sealing surface 315 to be placed on the upper side 313 of the etched lead frame 310. The mold core 311 is subdivided into three sections by two groove-shaped molding tool cavities 316, 317 extending transversely to the plane of the drawing. As shown in FIG. 9, the groove-shaped molding tool cavities 316, 317 are used as feed channels to fill the separating region 118 and the trench structure 120. In this method situation, the mold core 311 bears with its sealing surface 315 directly on the structured lead frame 310, the sealing surface 315 sealing the trench structure 120 along a part of its circumference. By injecting the molding material via corresponding channels (not shown here) into the molding tool parts 310, 320, the cavities 315, 316, 317, 318 and the region of the lead frame 110 connected to these cavities are fully filled. This method state is shown in FIG. 10.

The molding material may encapsulate particular sections of the component, but leaves at least parts of the contact pads 116, 117 arranged on the lower side 114 uncovered. The exposed surfaces of the pads 116, 117 may be used as external contact elements for electrical coupling of the component to other parts, for example, a circuit board, for instance a PCB (printed circuit board).

After completion of the injection molding process, the lead frame 110 together with the molded body 130 surrounding it forms the finished carrier 170. As is shown in the sectional representation of FIG. 11, the package 131 is configured in the form of a raised material arranged on the upper side 113 of the lead frame 110 and integrated in the molded body. The trench structure 120 arranged in the region of the cavity 132 is filled with molding material as far as the upper edge so that a sharp transition between the metallic material of the lead frame 110 and the molding material, consisting, for example, of plastic of the trench filling is obtained on the edge 121 produced photolithographically with high precision. This edge 121 therefore constitutes a precise alignment mark for alignment of the semiconductor chip on the lead frame 110. When a dark molding material is used, a high optical contrast is obtained between the trench 120 and the surface of the unetched lead frame 110 that allows rapid and reliable detection of the mark by corresponding optical detection devices.

Figure 12:
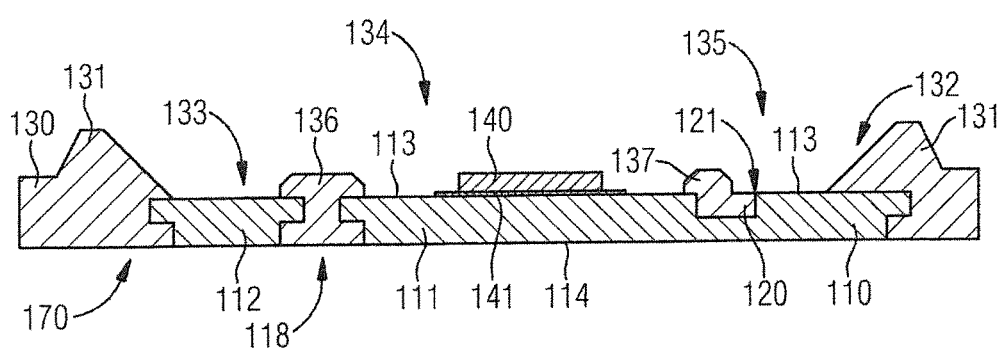
FIG. 12 shows the carrier of FIG. 11 in the assembly process.

In the so-called assembly process, each of the components processed next to one another is respectively equipped with an optoelectronic semiconductor chip 140. To this end, the position of each component is approached individually and the optoelectronic semiconductor chip 140 is placed onto the surface of the first lead frame part 111. The fastening of the semiconductor chip 140 on the surface of the first lead frame part 111 may be carried out by an adhesive pellet 141 or by a thermoplastic solder. In both cases, the alignment of the semiconductor chip 140 takes place during the fastening process with the aid of the at least one edge 121 of the edge structure 120. The corresponding method situation is shown in FIG. 12.

Figure 13:
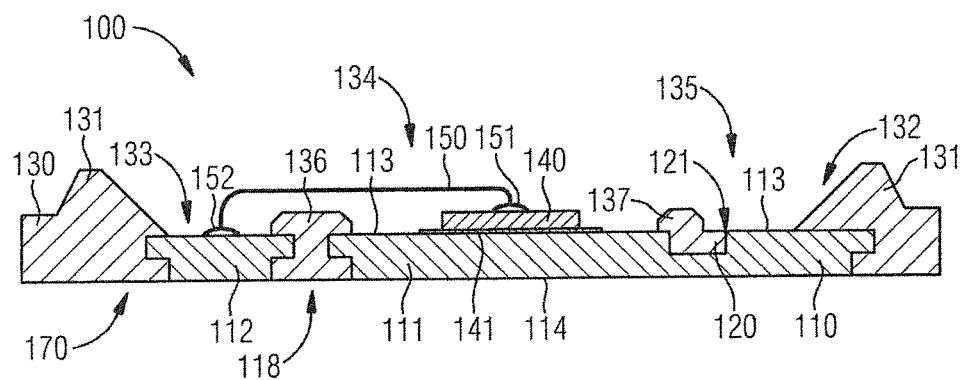
FIG. 13 shows the arrangement of FIG. 12 after the bonding of the semiconductor chip.

Subsequently, the electrical connection of the optoelectronic semiconductor chip 140 is carried out, in this example with a bonding wire 150 being fed from a contact position 151 of the second lead frame part 112 to a contact point 151 formed on the upper side of the semiconductor chip 140. This method state is shown in FIG. 13. After the cavity 132 has subsequently been filled with a suitable encapsulation compound, the components 100 processed on the panel may be individualized, for example, by sawing.

Figure 14:
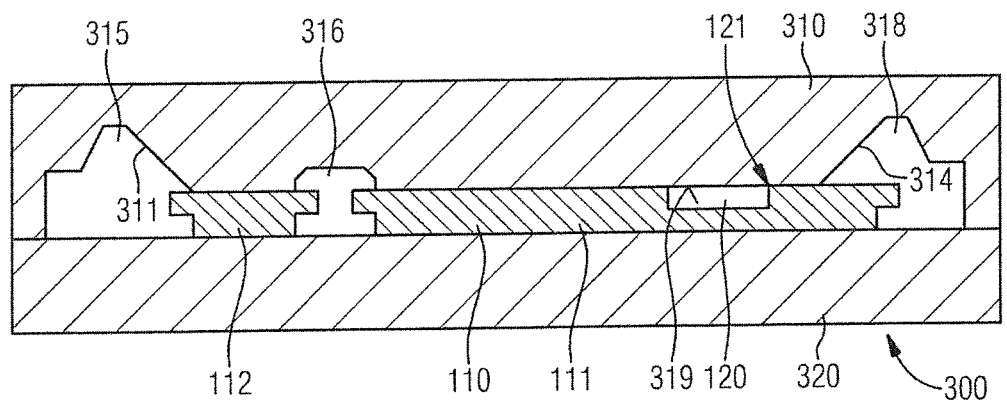
FIG. 14 shows a lead frame arranged in a molding tool for the production of an alternative example in which the trench structure is not filled with molding material.

As alignment marks for aligning the optoelectronic semiconductor chip 140 on the lead frame 110, it is also possible to use photolithographically produced trench structures which do not have any filling. To this end, it is necessary to seal these trench structures during the injection molding, transfer molding or compression molding method so that no molding material can enter the trench structure from a cavity to be filled. This may, as is indicated in FIG. 14, be done by arranging the trench structure 120 in a central region of the sealing surface 319 of the mold core 311 of the upper molding tool part 310.

Figure 15:
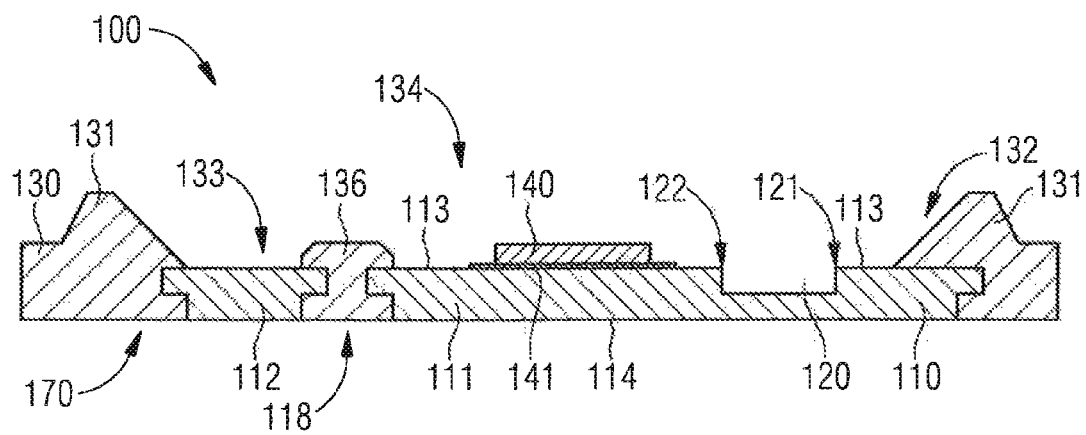
FIG. 15 shows the finished lead frame which has been molded around of FIG. 14 during the process of fitting with the optoelectronic semiconductor chip.

FIG. 15 shows a method state during the assembly process, in which the carrier 170 is equipped with the optoelectronic semiconductor chip 140. In this case, the trench structure 120, or the edges 121, 122 of the trench structure 120 produced with high precision in the lithographic process, are used as alignment marks to align the semiconductor chip 140 on the first lead frame part 111.

Figure 16:
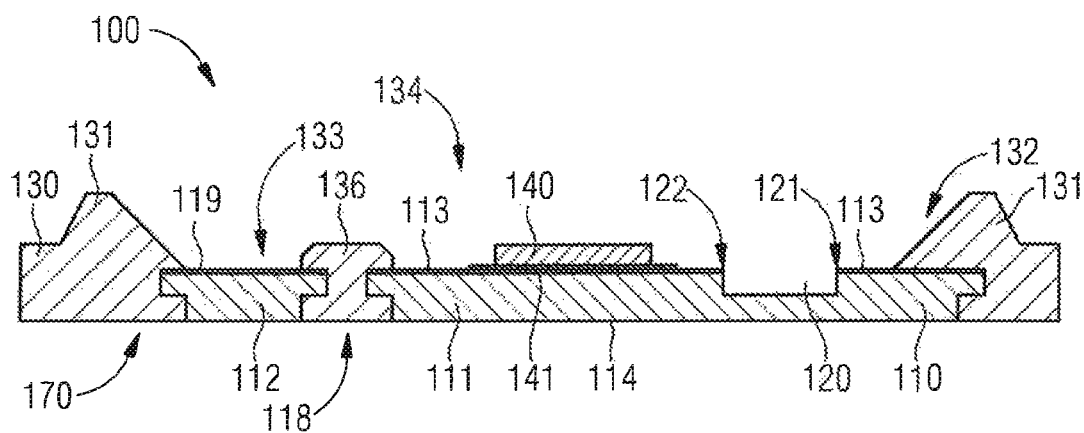
FIG. 16 shows an alternative example of the semifinished product, with a coating arranged on the surface of the lead frame.

To increase the contrast between etched and unetched material, the lead frame 110 may be provided with a surface coating 119. Since this coating, as is shown by way of example in FIG. 16, has been removed in the region of the trench structure 120 by the structuring of the lead frame 110, when the edges 121, 122 are observed perpendicularly there is a sharp material transition, the optical contrast of which depends on the materials used. There may be a copper lead frame with a gold coating.

Figure 17:
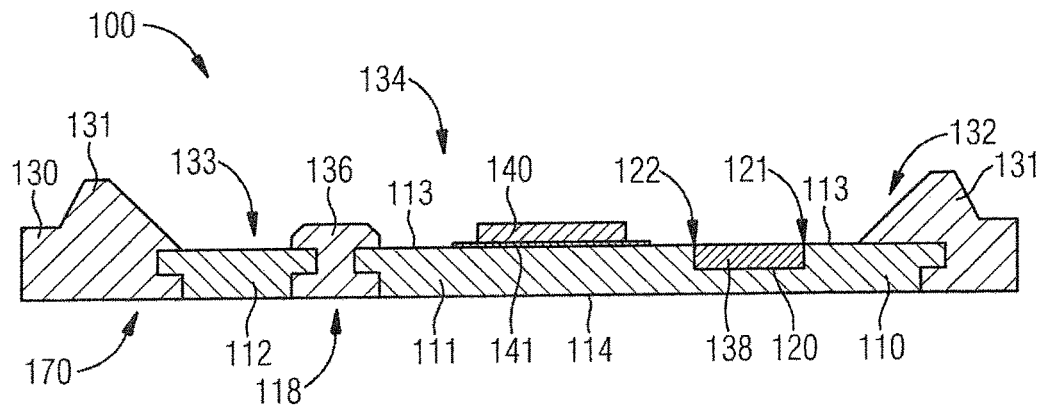
FIG. 17 shows the precursor of FIG. 15 with a trench filled by a material having a particularly high contrast with respect to the lead frame.

Good visibility of the alignment structure can likewise be achieved by filling a trench structure 120 with a material that has as high an optical contrast as possible with respect to the surface of the lead frame 110. This is favorable, in particular, when the molding material used for the molded body 130 can scarcely be distinguished visually from the surface of the lead frame 110. Filling the insulated trench structure 120 may in this case take place either before or after the production process of the molded body 130. A corresponding example is shown in FIG. 17.

Figure 18:
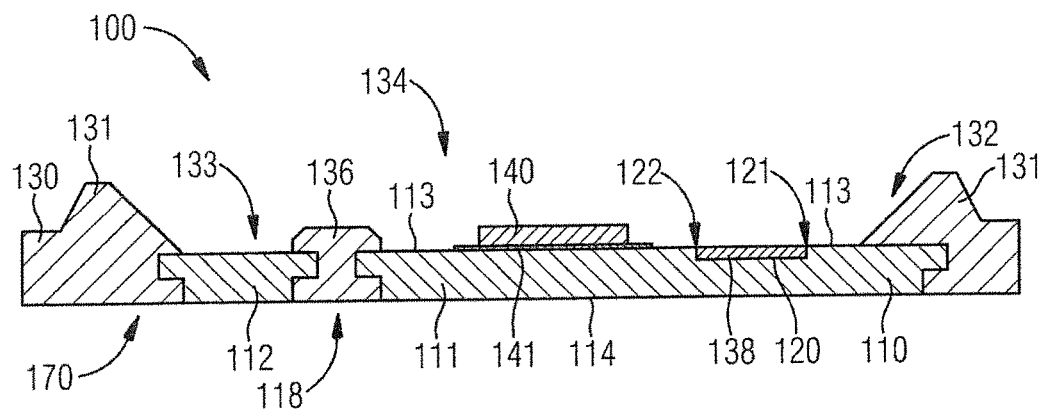
FIG. 18 shows an alternative configuration of the lead frame in which the trench structure has a smaller depth.

The trench structure 120 is preferably produced in a photolithographic structuring process, with which the lead frames of the individual components are structured from a common metal plate. It is, however, also possible to produce the trench structure 120 in a separate photolithographic structuring process. This is favorable, in particular, when sufficiently precise edges cannot be produced with the method used for the structuring of the lead frame. In such a case, the trench structure 120 may be produced with a significantly smaller depth. In this way, possible position errors of the trench edges that typically result from etching under the respective mask in the photolithographic etching process, are reduced. Furthermore, the process time of the separate etching step can be reduced by shorter etching times. FIG. 18 shows a corresponding example of the component 100 with a trench structure 120 having a reduced depth.

Figure 19:
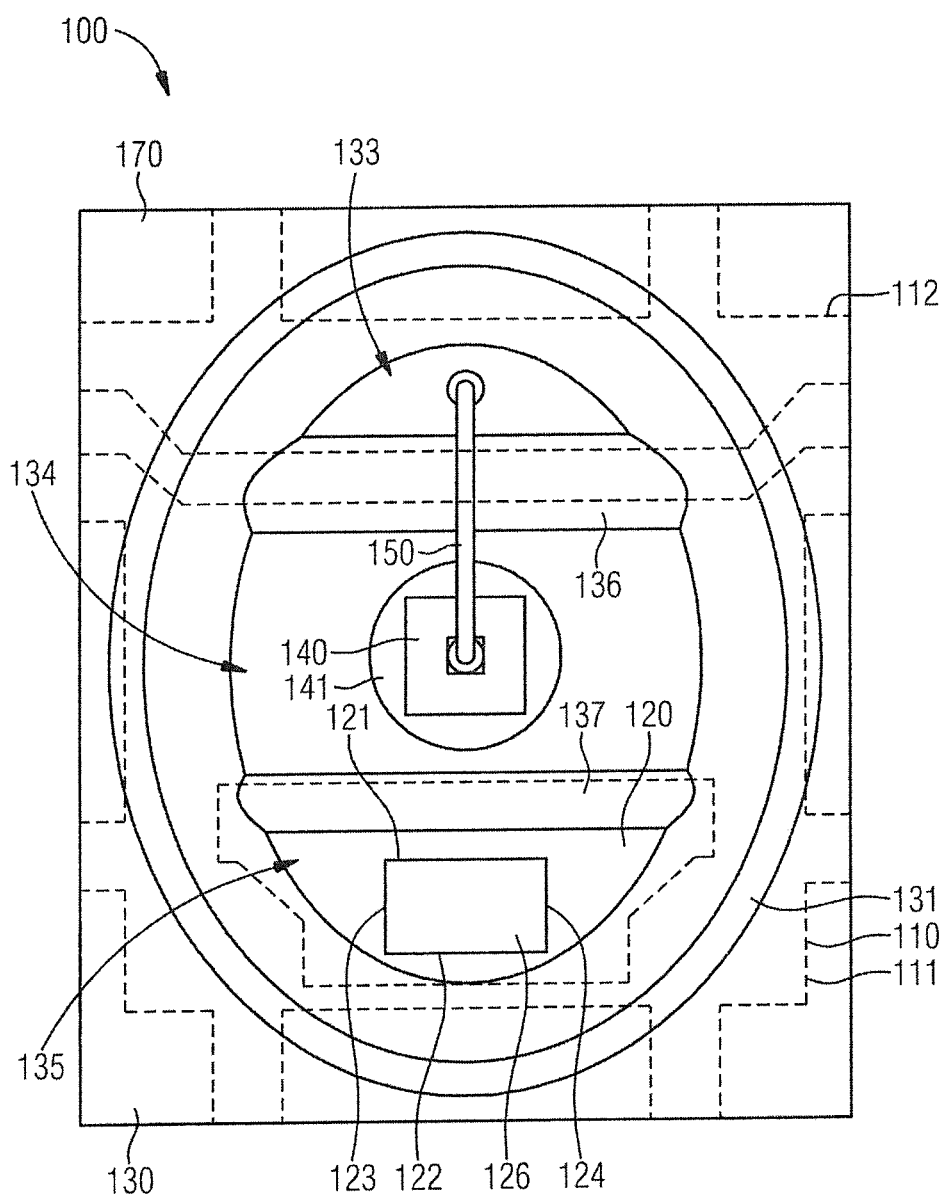
FIG. 19 shows a plan view of another example of the optoelectronic component with a trench structure having an insulated island structure.
Figure 20:
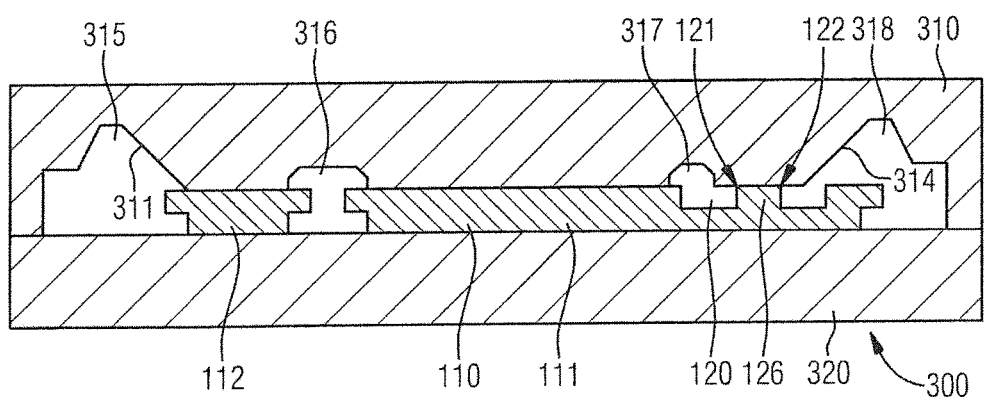
FIG. 20 shows a lead frame arranged in a molding tool during the production process of the example of FIG. 19.

The contour of the trench structure 120 used as an alignment mark may in principle vary. In this case, however, trench structures with edges as straight as possible and extend parallel to the main axes of the components, or of the equipment used to produce the components, may be expedient. To compensate for position deviations of the etched edges due to etching underneath, mirror-symmetrically arranged edges extending parallel to one another may be provided. In structures with such edges, the geometrical middle, or symmetry axis, of the respective structure can be determined relatively easily. Since the determined position of the symmetry axis is independent of the offset of the structure edges relative to the corresponding mask edges due to etching underneath, alignment of the semiconductor chip is carried out with the aid of this symmetry axis. The trench structure 120, shown by way of example in FIG. 19, with an insulated island structure 126 represents a possible example. The rectangularly configured island structure 126, respectively, has two trench edges 121, 122, 123, 124 extending parallel to the main axes of the component. The trench structure 120 may be filled with the molding material of the molded body 130 to increase the contrast. To produce such a trench structure filled with molding material, it is possible to use a molding tool 300 which seals the insulated island structure 126 along its entire circumference relative to the trench structure 120. Such a method situation is shown as a sectional representation in FIG. 20.

Figure 21:
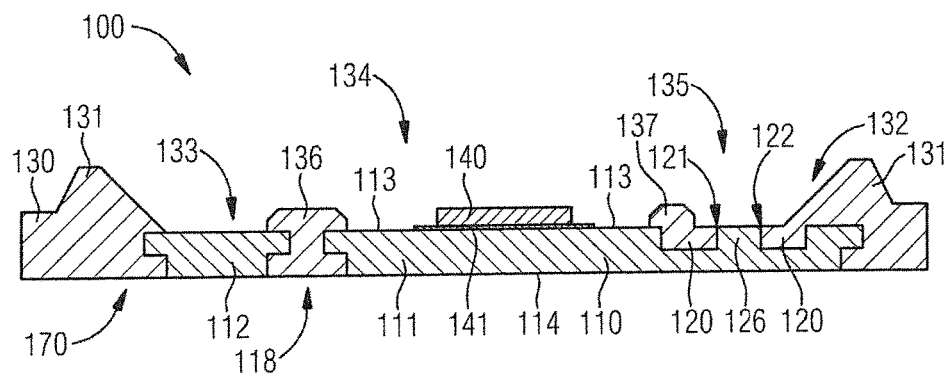
FIG. 21 shows a semifinished product produced in the molding tool of FIG. 20 during the fitting process.

FIG. 21, conversely, shows the corresponding carrier 170 during an assembly process in which the optoelectronic semiconductor chip 140 is fastened on the surface of the first lead frame part 111. In this case, the semiconductor chip 140 is aligned with the aid of the edges 121, 122, 123, 124 used pairwise as alignment marks.

Although our components and methods have been illustrated and described in detail with the aid of the preferred example, this disclosure is not restricted to the examples disclosed and other variants may be derived therefrom by those skilled in the art without departing from the scope of protection of the disclosure. Although an optoelectronic component having a premold package is described here, the concept may also be applied to other package concepts.

This application claims priority of DE 10 2013 224 581.5, the subject matter of which is incorporated herein by reference.

The invention claimed is:

1. A method of producing an optoelectronic component comprising a lead frame embedded in a molded body and an optoelectronic semiconductor chip arranged on an upper side of the lead frame comprising:
   providing a lead frame subdivided by a separating region into a first lead frame part and a second lead frame part;
   carrying out an etching step in which at least one trench structure is produced on the upper side of the first lead frame part;
   producing the molded body by molding a molding material around the lead frame such that 1) a cavity is formed and exposes a region of the upper side of the first lead frame part and a region of the upper side of the second lead frame part, and 2) the trench structure is provided on the upper side of the exposed region of the first lead frame part; and
   arranging the optoelectronic semiconductor chip on the upper side of the exposed region of the first lead frame part such that the trench structure is used as an alignment mark to align the optoelectronic semiconductor chip on the first lead frame part,
   wherein a coating forming an optical contrast with respect to the material of the lead frame is produced on the upper side of the lead frame, and
   a portion of the coating is removed from the upper side in the region of the trench structure during the etching process to increase the contrast between etched and unetched material of the lead frame.

2. The method as claimed in claim 1, wherein the trench structure is produced in the scope of photolithographic structuring of the lead frame, carried out from the upper and lower sides, in which the lead frame is fully separated in at least the separating region by upper- and lower-side etching to form the first lead frame part and the second lead frame part, and the lead frame is etched only on the upper side in the region intended for the trench structure to produce the trench structure.

3. The method as claimed in claim 1, wherein the trench structure is filled in a planar fashion with a filler material to increase the contrast with respect to the material of the lead frame.

4. The method as claimed in claim 1, wherein the trench structure is filled in a planar fashion with the molding material in the scope of the production of the molded body.

5. The method as claimed in claim 1,
   wherein the trench structure is produced with at least one straight edge forming a sharp transition between etched and unetched regions of the lead frame, and
   the at least one straight edge is used as an alignment mark during the alignment of the optoelectronic semiconductor chip on the lead frame.

6. The method as claimed in claim 5,
   wherein the trench structure is produced with an island region contained by the at least one straight edge, and
   the surface of the island region is sealed from the trench structure during the production of the molded body.

7. The method as claimed in claim 1, wherein at least one edge region of the trench structure is produced in a region outside the cavity.

8. An optoelectronic component comprising:
   a lead frame subdivided by a separating region into a first lead frame part and a second lead frame part;
   a molded body that embeds the lead frame and forms a package having a cavity that exposes a region of the upper side of the first lead frame part and a region of the upper side of the second lead frame part, at least one trench structure which is used as an alignment structure being provided on the upper side of the exposed region of the first lead frame part; and
   at least one optoelectronic semiconductor chip that generates light radiation arranged on the upper side of the exposed region of the first lead frame part,
   wherein the trench structure comprises an island region forming at least one straight edge with the trench structure,
   the at least one straight edge is configured as an alignment structure and extends parallel to a main axis of the component, and
   the island region is configured rectangularly and extends beyond the cavity under the molded body.

9. The optoelectronic component as claimed in claim 8, wherein the island region is formed in an insulated fashion in the trench structure and is configured rectangularly.

10. The optoelectronic component as claimed in claim 8, wherein the trench structure is filled in a planar fashion with the molding material of the molded body.

11. An optoelectronic component comprising:
 a lead frame subdivided by a separating region into a first lead frame part and a second lead frame part;
 a molded body that embeds the lead frame and forms a package having a cavity that exposes a region of the upper side of the first lead frame part and a region of the upper side of the second lead frame part, at least one trench structure used as an alignment structure being provided on the upper side of the exposed region of the first lead frame part, wherein the separating region and the trench structure are filled molding material, and the cavity is subdivided into three sections by two bar-shaped structures; and
 at least one optoelectronic semiconductor chip that generates light radiation, arranged on the upper side of the exposed region of the first lead frame part,
 wherein the trench structure comprises an island region forming at least one straight edge with the trench structure,
 the at least one straight edge is configured as an alignment structure and extends parallel to a main axis of the component, and
 the island region is configured rectangularly and extends beyond the cavity under the molded body.

12. The optoelectronic component as claimed in claim 11, wherein the island region is formed in an insulated fashion in the trench structure and is configured rectangularly.

13. The optoelectronic component as claimed in claim 11, wherein the trench structure is filled in a planar fashion with the molding material of the molded body.

* * * * *